United States Patent
Matsuno et al.

(10) Patent No.: US 11,437,465 B2
(45) Date of Patent: Sep. 6, 2022

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Yoshinori Matsuno, Tokyo (JP); Yasushi Takaki, Tokyo (JP); Kensuke Taguchi, Tokyo (JP); Kosuke Miyazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/845,716

(22) Filed: Apr. 10, 2020

(65) Prior Publication Data

US 2020/0395439 A1 Dec. 17, 2020

(30) Foreign Application Priority Data

Jun. 13, 2019 (JP) .............................. JP2019-110328

(51) Int. Cl.
*H01L 29/06* (2006.01)
*H01L 29/47* (2006.01)
(Continued)

(52) U.S. Cl.
CPC ........ *H01L 29/0619* (2013.01); *H01L 29/401* (2013.01); *H01L 29/47* (2013.01); *H01L 29/1608* (2013.01)

(58) Field of Classification Search
CPC . H01L 29/66143; H01L 29/872; H01L 29/47; H01L 29/1608; H01L 29/0619;
(Continued)

(56) References Cited

U.S. PATENT DOCUMENTS

2012/0104456 A1* 5/2012 Yu ........................... H01L 29/32
257/109
2015/0001554 A1 1/2015 Imai
(Continued)

FOREIGN PATENT DOCUMENTS

JP S59-003978 A 1/1984
JP 2009260329 A 11/2009
(Continued)

OTHER PUBLICATIONS

An Office Action; "Notice of Reasons for Refusal", mailed by the Japanese Patent Office dated Dec. 28, 2021, which corresponds to Japanese Patent Application No. 2019-110328 and is related to U.S. Appl. No. 16/845,716; with English language translation.
(Continued)

*Primary Examiner* — Shahed Ahmed
*Assistant Examiner* — Khatib A Rahman
(74) *Attorney, Agent, or Firm* — Studebaker & Brackett PC

(57) ABSTRACT

A semiconductor device includes an insulating layer provided on a first impurity layer and a second impurity layer on a termination region side, a metallized layer provided on the first impurity layer and the second impurity layer exposed from the insulating layer and on the insulating layer, and an electrode provided on the metallized layer. A position of a first end of the metallized layer on the termination region side and a position of a second end of the electrode on the termination region side are the same in plan view.

6 Claims, 9 Drawing Sheets

(51) Int. Cl.
*H01L 29/40* (2006.01)
*H01L 29/16* (2006.01)

(58) Field of Classification Search
CPC .............. H01L 29/401; H01L 29/6606; H01L 29/7395; H01L 29/417
See application file for complete search history.

(56) References Cited

U.S. PATENT DOCUMENTS

| | | | | |
|---|---|---|---|---|
| 2015/0060882 | A1* | 3/2015 | Tarui | H01L 29/1608 257/77 |
| 2015/0318357 | A1* | 11/2015 | Tadokoro | H01L 21/0495 257/77 |
| 2016/0056306 | A1* | 2/2016 | Masuoka | H01L 29/7393 257/483 |
| 2016/0163792 | A1* | 6/2016 | Oka | H01L 29/2003 257/636 |
| 2017/0221998 | A1 | 8/2017 | Ebihara et al. | |
| 2017/0236935 | A1* | 8/2017 | Ebihara | H01L 29/1608 257/77 |
| 2017/0263701 | A1 | 9/2017 | Oka et al. | |
| 2018/0040563 | A1* | 2/2018 | Yoshida | H01L 21/76865 |
| 2018/0138272 | A1* | 5/2018 | Ebihara | H01L 29/66068 |
| 2019/0109005 | A1* | 4/2019 | Ichikawa | H01L 29/872 |
| 2019/0172715 | A1* | 6/2019 | Zanetti | H01L 21/046 |

FOREIGN PATENT DOCUMENTS

| | | |
|---|---|---|
| JP | 2013-102087 A | 5/2013 |
| JP | 2015211179 A | 11/2015 |
| JP | 2016-111253 A | 6/2016 |
| JP | 2017-201724 A | 11/2017 |
| JP | 2019-071340 A | 5/2019 |
| WO | 2013146326 A1 | 10/2013 |
| WO | 2015/166608 A1 | 11/2015 |

OTHER PUBLICATIONS

An Office Action; "Notice of Reasons for Refusal", mailed by the Japanese Patent Office dated Sep. 14, 2021, which corresponds to Japanese Patent Application No. 2019-110328 and is related to U.S. Appl. No. 16/845,716; with English language translation.

An Office Action; "Notice of Reasons for Refusal", mailed by the Japanese Patent Office dated Jul. 19, 2022, which corresponds to Japanese Patent Application No. 2019-110328 and is related to U.S. Appl. No. 16/845,716; with English language translation.

* cited by examiner

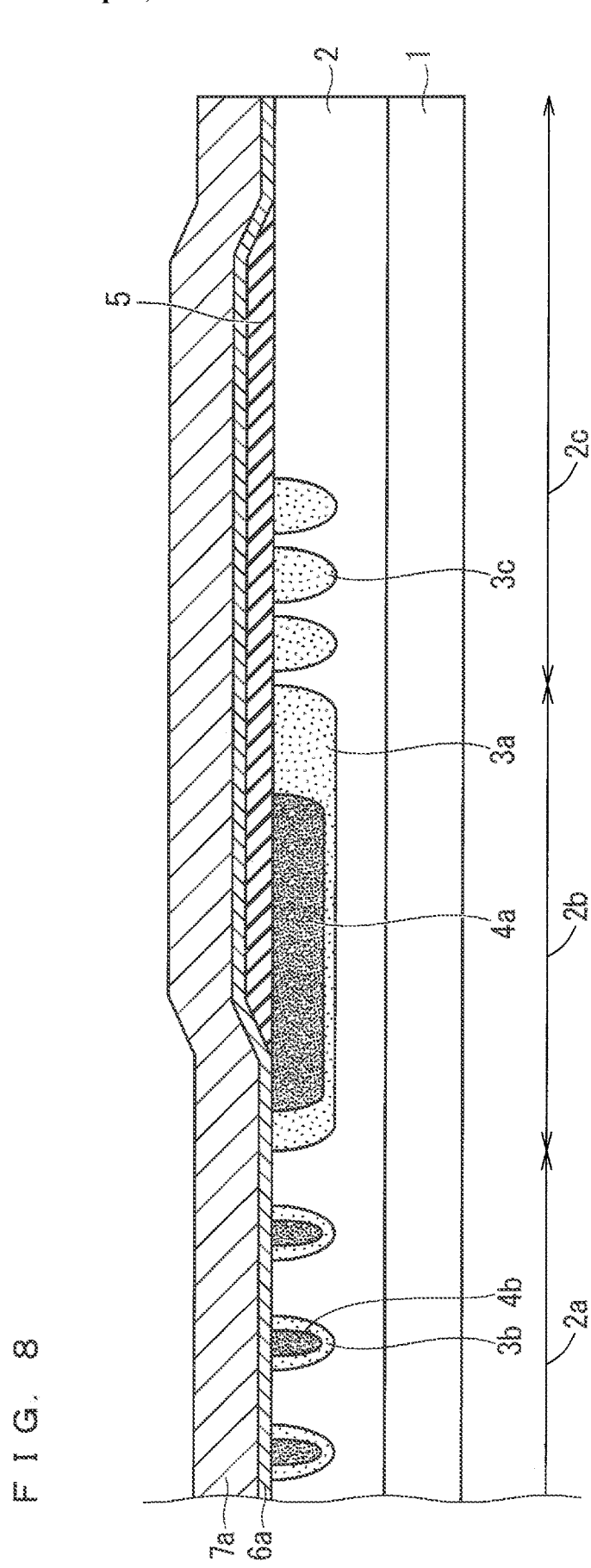

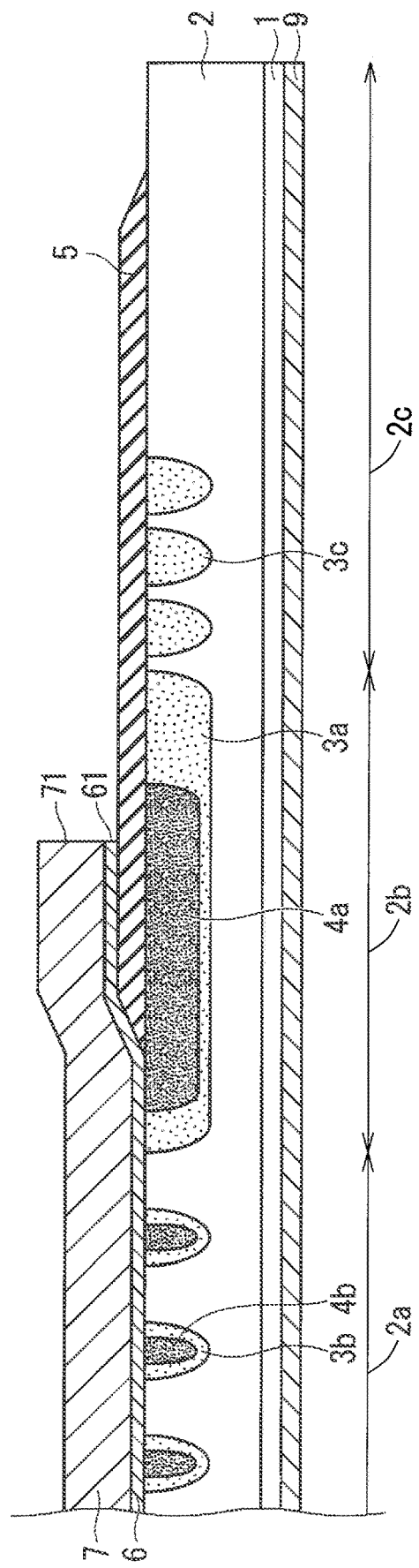

SEMICONDUCTOR DEVICE AND METHOD FOR MANUFACTURING SEMICONDUCTOR DEVICE

BACKGROUND OF THE INVENTION

Field of the Invention

The present invention relates to a semiconductor device and a method for manufacturing a semiconductor device.

Description of the Background Art

A diode including a metallized layer functioning as a Schottky metal and an electrode provided thereon has been proposed. For example, Japanese Patent Application Laid-Open No. 2015-211179 proposes a technique for patterning a metallized layer and an electrode all together by wet etching.

However, in a case where wet etching is performed as described in Japanese Patent Application Laid-Open No. 2015-211179, the following problems occur. When etching selectivity of the metallized layer with respect to the electrode is large, an end of the metallized layer is etched to an inner side of the metallized layer more than an end of the electrode so that a cave-like shape is created. Meanwhile, when the etching selectivity of the metallized layer with respect to the electrode is small, a whisker-like residue is generated in the metallized layer.

As described above, according to the technique of Japanese Patent Application Laid-Open No. 2015-211179, the metallized layer may not be appropriately patterned. This results in variations in performance such as electrical characteristics among manufactured semiconductor devices, leading to a decrease in reproducibility of the semiconductor devices and eventually to a decrease in reliability of the semiconductor devices. The above problems become more apparent especially in a case where a thickness of the metallized layer is on the order of submicrons and a thickness of the electrode is several microns or more, that is, in a case where the thickness of the electrode is several tens of times the thickness of the metallized layer.

SUMMARY

The present invention has been made in view of the above problems, and an object of the present invention is to provide a technique capable of improving the reliability of a semiconductor device.

The present invention is a semiconductor device including a buffer layer having a first conductivity type; a drift layer provided on the buffer layer and in which an active region, an interface region that surrounds the active region, and a termination region that surrounds the interface region are defined, the drift layer having a first conductivity type; a first impurity layer provided in a surface of the drift layer in the interface region, the first impurity layer having a second conductivity type; a second impurity layer that is provided in a surface of the first impurity layer, has a side and a bottom covered with the first impurity layer, and has an impurity concentration higher than the first impurity layer, the second impurity layer having a second conductivity type; an insulating layer from which the first impurity layer and the second impurity layer on the active region side are exposed and that is provided on the first impurity layer and the second impurity layer on the termination region side; a metallized layer provided on the first impurity layer and the second impurity layer exposed from the insulating layer and on the insulating layer; and an electrode provided on the metallized layer, wherein a position of a first end of the metallized layer on the termination region side and a position of a second end of the electrode on the termination region side are the same in plan view.

The reliability of the semiconductor device can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 to 9 are cross-sectional views each illustrating a step for manufacturing the semiconductor device according to the first preferred embodiment.

DESCRIPTION OF THE PREFERRED EMBODIMENTS

First Preferred Embodiment

Hereinafter, a configuration in which a first conductivity type is n-type and a second conductivity type is p-type will be described as an example. However, this configuration is not restrictive, and the first conductivity type may be p-type and the second conductivity type may be n-type.

Figure 1:
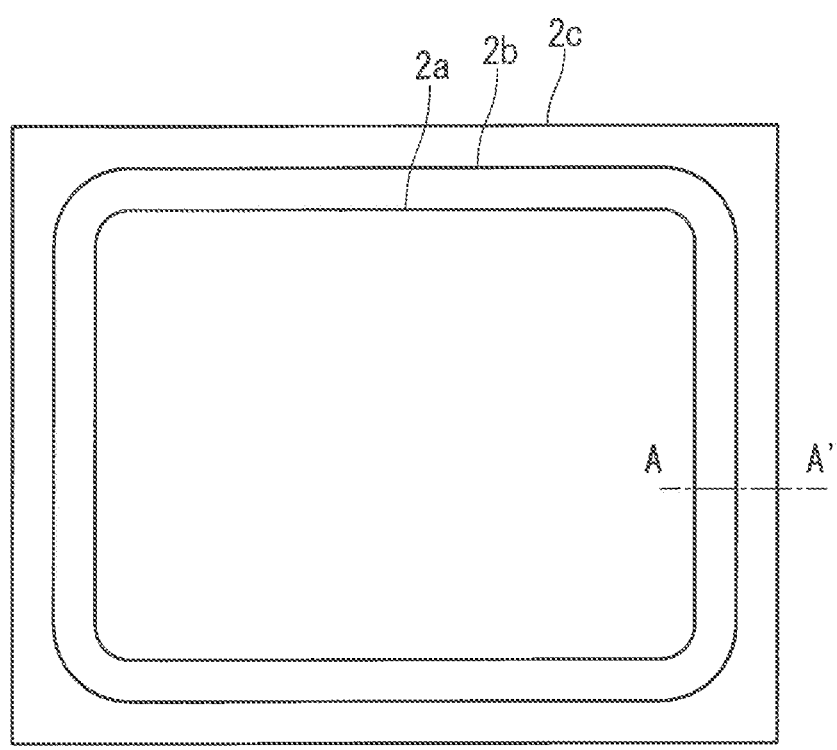
FIG. 1 is a plan view illustrating a configuration of a semiconductor device according to a first preferred embodiment.
Figure 2:
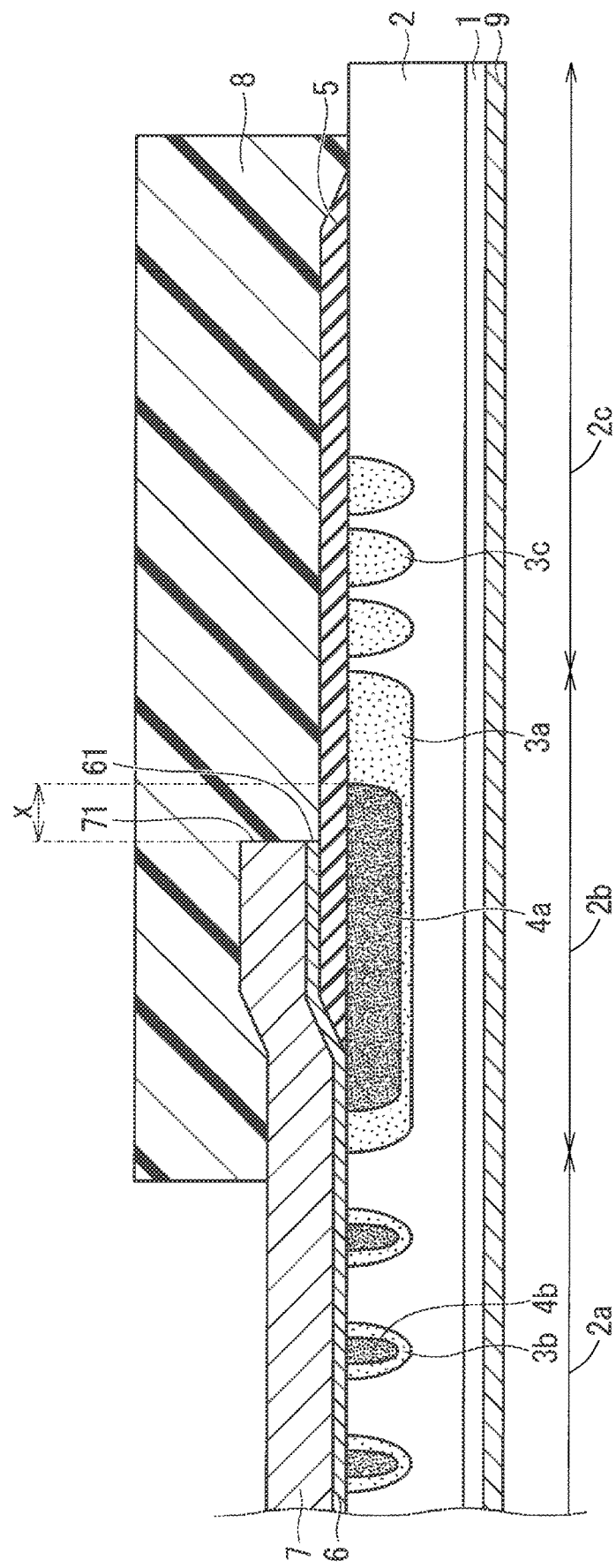
FIG. 2 is a cross-sectional view illustrating a configuration of the semiconductor device according to the first preferred embodiment.

FIG. 1 is a plan view illustrating a configuration of a semiconductor device according to the first preferred embodiment of the present invention, and FIG. 2 is a cross-sectional view taken along line A-A' of FIG. 1. As illustrated in FIG. 1, in the semiconductor device according to the first preferred embodiment, an active region 2a, an interface region 2b surrounding the active region 2a, and a termination region 2c surrounding the interface region 2b are defined.

The semiconductor device of FIG. 2 includes a buffer layer 1, a drift layer 2, p injection layers 3a, 3b, 3c, p+ injection layers 4a and 4b, an oxide film 5, and a metallized layer 6 functioning as a Schottky metal, an electrode 7, a coating sealing material 8, and a back surface electrode 9.

The conductivity type of the buffer layer 1 is $n^+$, and an n-type impurity concentration of the buffer layer 1 is relatively high. In the following description, it is assumed that the buffer layer 1 is a semiconductor substrate. Note, however, that the buffer layer 1 is not limited to this, and may be, for example, an epitaxial growth layer.

The drift layer 2 is provided on the buffer layer 1. The conductivity type of the drift layer 2 is $n^-$, and an n-type impurity concentration of the drift layer 2 is relatively low. A total thickness of the buffer layer 1 and the drift layer 2 is, for example, 100 sm. In the first preferred embodiment, it is assumed that a material of the buffer layer 1 and the drift layer 2 is silicon carbide (SiC). Note, however, that the material of the buffer layer 1 and the drift layer 2 is not limited to this and can be any of other wide band gap semiconductors such as gallium nitride (GaN) and diamond or silicon (Si).

In the drift layer 2, the active region 2a, the interface region 2b, and the termination region 2c described above are defined. In the active region 2a, for example, at least one of a metal oxide semiconductor field effect transistor (MOSFET), a Schottky barrier diode (SBD), a junction barrier Schottky (JBS), a merged pin Schottky (MPS) diode, and an insulated gate bipolar transistor (IGBT) is provided.

The p injection layers 3a, 3b, and 3c form a structure for alleviating electric field concentration at an end of the Schottky electrode so that a required withstand voltage is stably ensured in the semiconductor device. The p injection layer 3a, which is a first impurity layer, is provided in a surface of the drift layer 2 in the interface region 2b and forms a guard ring. The conductivity type of the p injection layer 3a is p. A position of an end of the p injection layer 3a on the active region 2a side corresponds to a position of a boundary between the active region 2a and the interface region 2b, and a position of an end of the p injection layer 3a on the termination region 2c side corresponds to a position of a boundary between the interface region 2b and the termination region 2c. Note that "correspond" as used herein means "same" or "almost same".

The p injection layer 3b is provided in the surface of the drift layer 2 in the active region 2a and forms a JBS. The p injection layer 3c is provided in the surface of the drift layer 2 in the termination region 2c and forms a junction termination extension (JTE) or a field limiting ring (FLR).

The p$^+$ injection layers 4a and 4b are provided in order to further stably secure a required withstand voltage in the semiconductor device. The p$^+$ injection layer 4a, which is a second impurity layer, is provided in the surface of the p injection layer 3a, and a side and a bottom of the p$^+$ injection layer 4a are covered with the p injection layer 3a. The conductivity type of the p$^+$ injection layer 4a is p$^+$, and an impurity concentration of the p$^+$ injection layer 4a is higher than an impurity concentration of the p injection layer 3a. The p$^+$ injection layer 4a forms a guard ring similarly to the p injection layer 3a.

The p$^+$ injection layer 4b is disposed in the surface of the p injection layer 3b, and a side and a bottom of the p$^+$ injection layer 4b are covered with the p injection layer 3b. The conductivity type of the p$^+$ injection layer 4b is p$^+$, and an impurity concentration of the p$^+$ injection layer 4b is higher than an impurity concentration of the p injection layer 3b. The p$^+$ injection layer 4b forms a JBS similarly to the p injection layer 3b.

The oxide film 5, which is an insulating layer, is provided on the p injection layer 3a and the p$^+$ injection layer 4a on the termination region 2c side while exposing the p injection layer 3a and the p$^+$ injection layer 4a on the active region 2a side. In the first preferred embodiment, the oxide film 5 in the interface region 2b extends so as to extend beyond a position of p injection layer 3c in termination region 2c. A material of the oxide film 5 is, for example, silicon dioxide (SiO$_2$).

The metallized layer 6 is provided on the p injection layer 3a and p+ injection layer 4a exposed from the oxide film 5 and on the oxide film 5. In the first preferred embodiment, the metallized layer 6 is provided not only in the interface region 2b but also in the active region 2a.

In the following description, it is assumed that a material of the metallized layer 6 is titanium (Ti). Note, however, that the material of the metallized layer 6 is not limited to this, and may be a metal material such as molybdenum (Mo) or tungsten (W). According to such a configuration, a good Schottky junction can be obtained. A work function of the metallized layer 6 and a pinning effect with SiC vary depending on the metal material of the metallized layer 6, and a forward barrier height φB obtained as, for example, diode characteristics also varies depending on the metal material of the metallized layer 6 accordingly. Therefore, the metal material of the metallized layer 6 may be selected according to the specifications of the semiconductor device. In a case where a dry thermal oxide film is formed as a protective film immediately before forming the metallized layer 6 on the drift layer 2 having n, a Schottky interface is stabilized. This can improve uniformity of the barrier height and reduce a reverse leakage current.

The electrode 7 is provided on the metallized layer 6 as a metal pad. A material of the electrode 7 is, for example, aluminum (Al) or AlSi. In the first preferred embodiment, a thickness of the metallized layer 6 is, for example, approximately 200 nm, whereas a thickness of the electrode 7 is, for example, approximately several μm in consideration of wire bonding in a later step.

The coating sealing material 8 covers at least part of the oxide film 5, a first end 61 of the metallized layer 6 on the termination region 2c side, and the electrode 7 in the interface region 2b. A material of the coating sealing material 8 is, for example, polyimide.

The back surface electrode 9 is provided on a back surface of the buffer layer 1 opposite to a surface on which the drift layer 2 is provided.

In the first preferred embodiment, according to the above configuration, a position of the first end 61 of the metallized layer 6 on the termination region 2c side and a position of a second end 71 of the electrode 7 on the termination region 2c side almost match each other in plan view. That is, the first end 61 of the metallized layer 6 and the second end 71 of the electrode 7 are flush with each other. In the first preferred embodiment, the first end 61 and the second end 71 are located between an end of the p$^+$ injection layer 4a on the active region 2a side and an end of the p$^+$ injection layer 4a on the termination region 2c side in plan view.

As described above, in the first preferred embodiment, the position of the first end 61 of the metallized layer 6 and the position of the second end 71 of the electrode 7 are the same in plan view, and there is substantially no gouging or residue at the first end 61 of the metallized layer 6. This can suppress variations in performance such as electric characteristics of the semiconductor device, leading to improvement of reproducibility of the semiconductor device and eventually to improvement of reliability of the semiconductor device.

Figure 3:
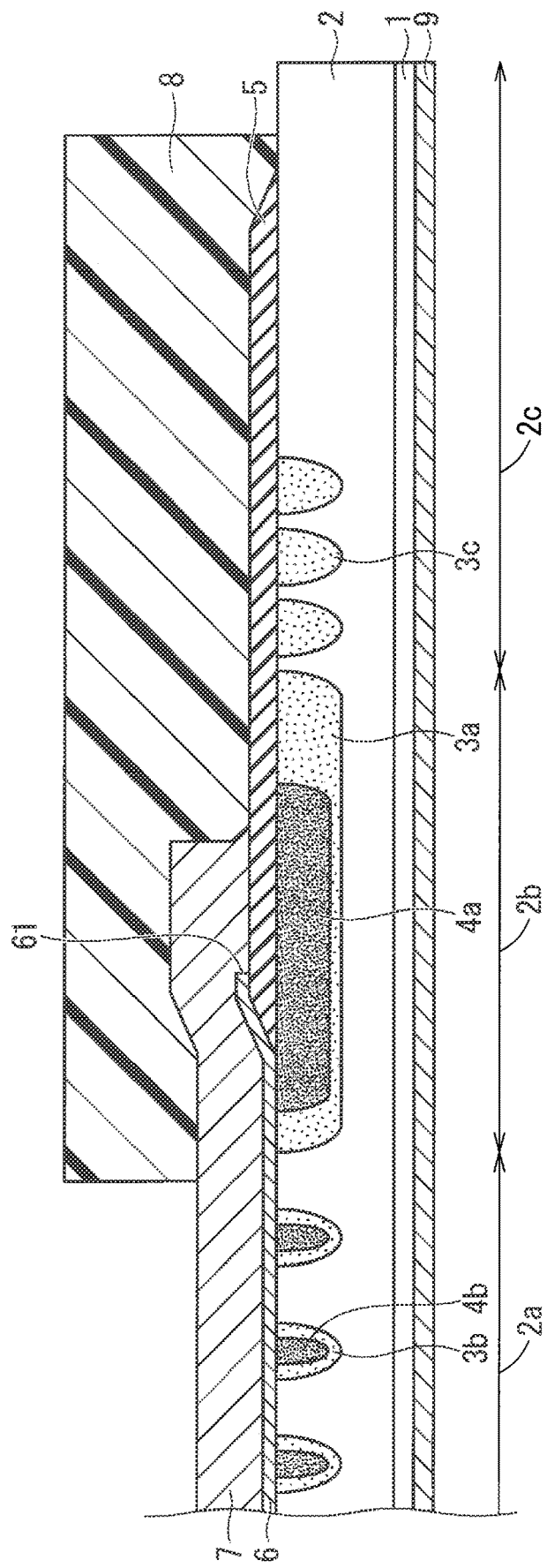
FIG. 3 is a cross-sectional view illustrating a configuration of a related semiconductor device.

The following describes a semiconductor device (hereinafter referred to as a "related semiconductor device") related to the first preferred embodiment configured to suppress the influence of gouging or residue in the first end 61 of the metallized layer 6. FIG. 3 is a cross-sectional view illustrating a configuration of the related semiconductor device. In the configuration of FIG. 3, the electrode 7 covers the first end 61 of the metallized layer 6. According to the related semiconductor device configured as described above, it is possible to suppress the influence of gouging or residue in the first end 61 of the metallized layer 6. However, since it is necessary to perform patterning on each of the metallized layer 6 and the electrode 7, there is a new problem that a manufacturing cost is relatively high.

As a method for suppressing the influence of gouging and residue of the first end 61 of the metallized layer 6, a lift-off method may be used for patterning the metallized layer 6 and the electrode 7, separately from the related semiconductor device. In this lift-off method, a metal film is formed on an entire surface of a photoresist selectively exposed in advance, and an ultrasonic wave or the like is applied thereto in an organic solvent such as acetone which dissolves the photoresist. As a result, only a part of the metal film formed on the dissolved photoresist is removed, and the other part of the metal film remains. That is, the metal film is patterned. Use of such a lift-off method can pattern a multilayer metal electrode such as the metallized layer 6 and the electrode 7 all together.

However, patterning using the lift-off method still tends to cause problems such as generation of a residue. Although techniques such as a jet lift-off method have been developed, such techniques are often unsuitable for mass production. In particular, when the thickness of the electrode 7 is several μm or more, it becomes difficult to dissolve the photoresist with acetone or the like.

On the other hand, according to the method for manufacturing a semiconductor device according to the first preferred embodiment described below, it is possible to suppress gouging or residue at the first end 61 of the metallized layer 6.

<Manufacturing Method>

FIGS. 4 to 9 are cross-sectional views illustrating a method for manufacturing a semiconductor device according to the first preferred embodiment. For patterning described below, for example, a photomechanical process and an etching process are appropriately used.

First, for example, an n+ type semiconductor substrate made of 411-SiC having an off angle of 8 degrees on the (0001) plane is prepared. Resistivity of this semiconductor substrate is, for example, approximately 0.02 Ω·cm. Since the semiconductor substrate serves as the buffer layer 1 when the semiconductor device is completed, the semiconductor substrate and the buffer layer 1 will be described below without distinction.

Figure 4:
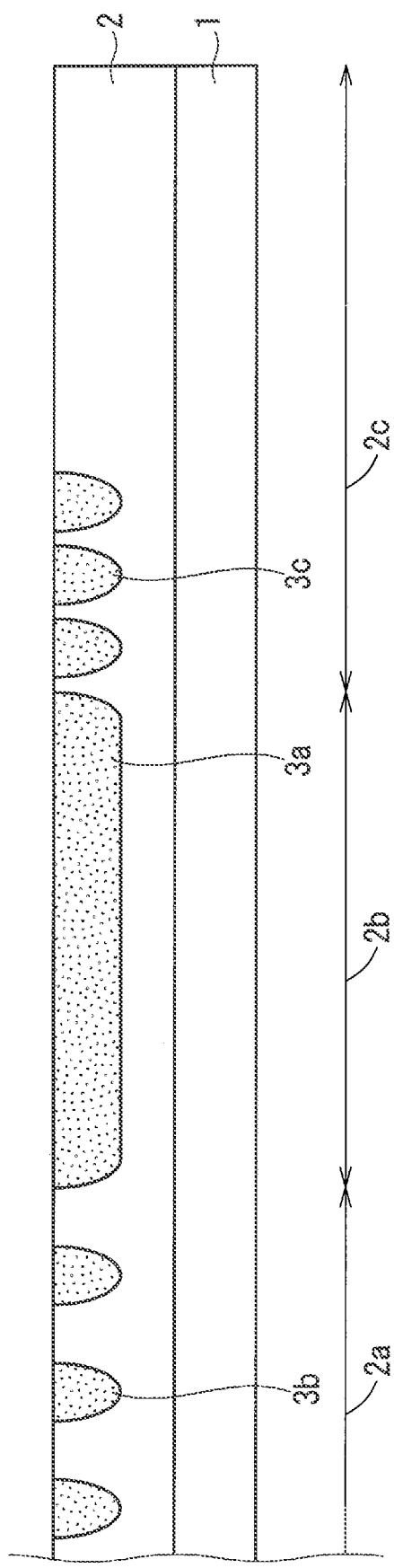

As illustrated in FIG. 4, the drift layer 2 is formed on the buffer layer 1 by epitaxial growth. An impurity concentration of the drift layer 2 is, for example, approximately $5 \times 10^5/cm^3$. The drift layer 2 is formed to have a thickness of, for example, approximately 5 μm to 30 μm so that a withstand voltage of the drift layer 2 becomes a desired withstand voltage of, for example, 600 V to 3300 V.

Then, as illustrated in FIG. 4, a patterned etching mask (not illustrated) is formed on the drift layer 2, and the p injection layers 3a, 3b, and 3c are formed by injecting, for example, Al ions into the surface of the drift layer 2 exposed from the etching mask.

Figure 5:
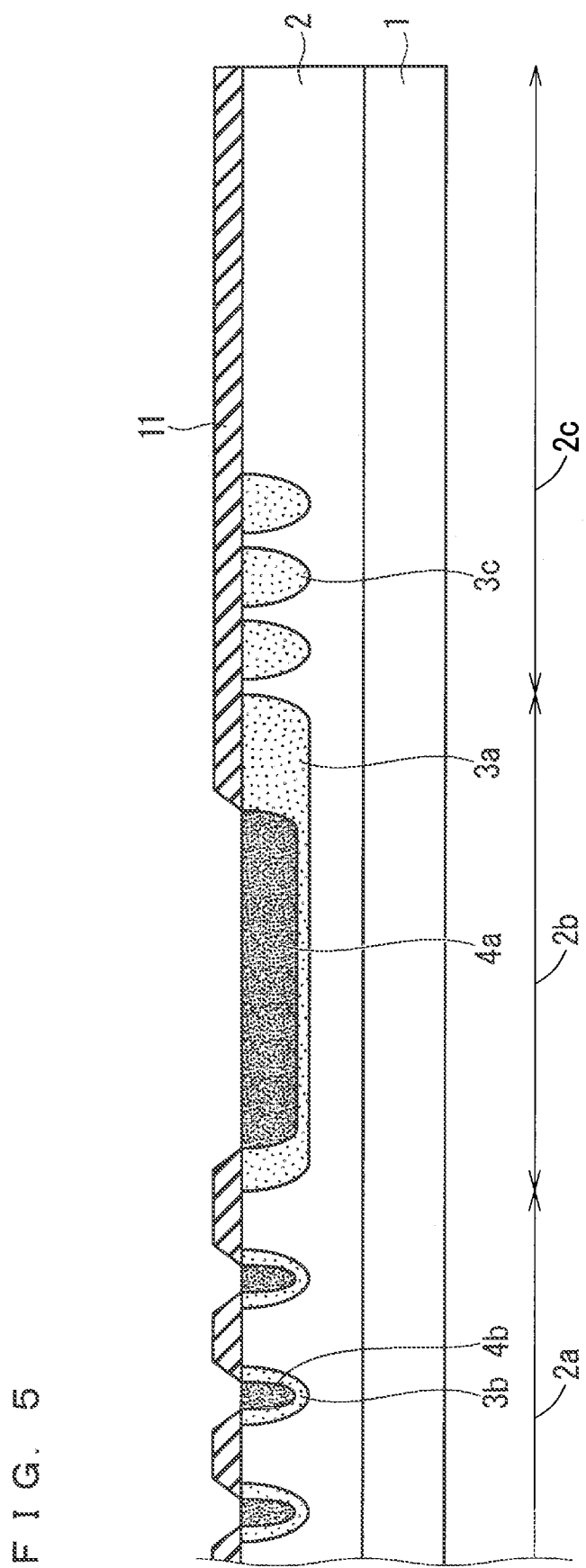

Next, as illustrated in FIG. 5, a patterned etching mask 11 such as $SiO_2$ is formed on the drift layer 2, and the p+ injection layers 4a and 4b are formed, for example, by injecting Al ions into surfaces of the p injection layers 3a and 3b exposed from the etching mask 11. Then, the p injection layers 3a, 3b, and 3c and the p+ injection layers 4a and 4b are activated and recrystallized by high-temperature annealing at approximately 1600° C. to 1700° C.

Figure 6:
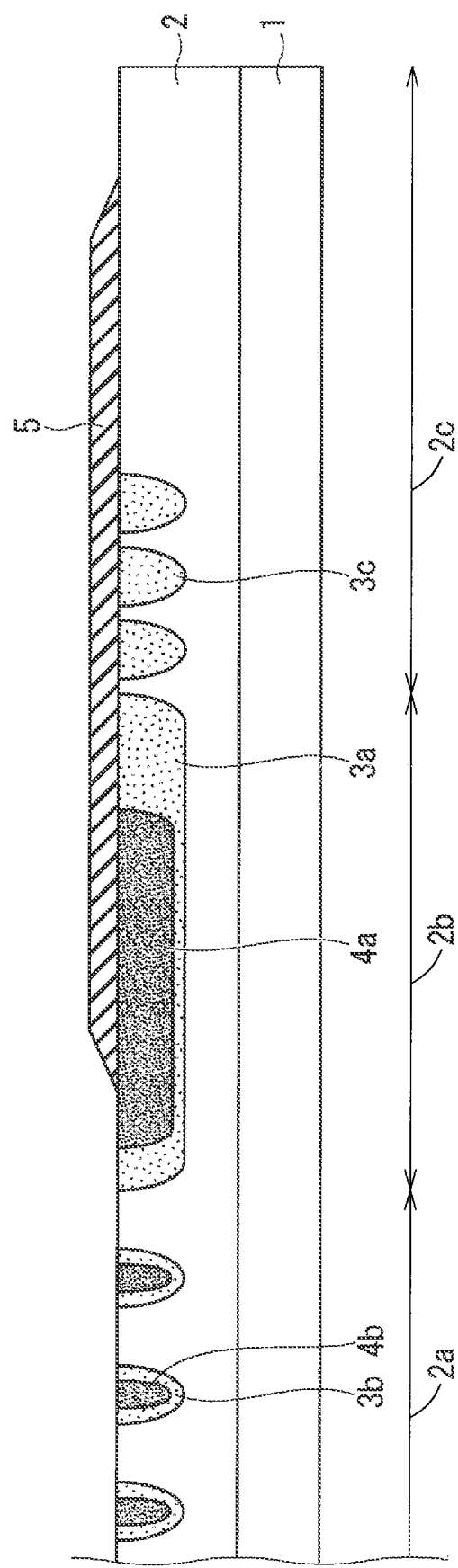

Then, as illustrated in FIG. 6, the oxide film 5 patterned so as to expose the p injection layer 3a and the p+ injection layer 4a on the active region 2a side is formed on the p injection layer 3a and the p+ injection layer 4a on the termination region 2c side.

Figure 7:
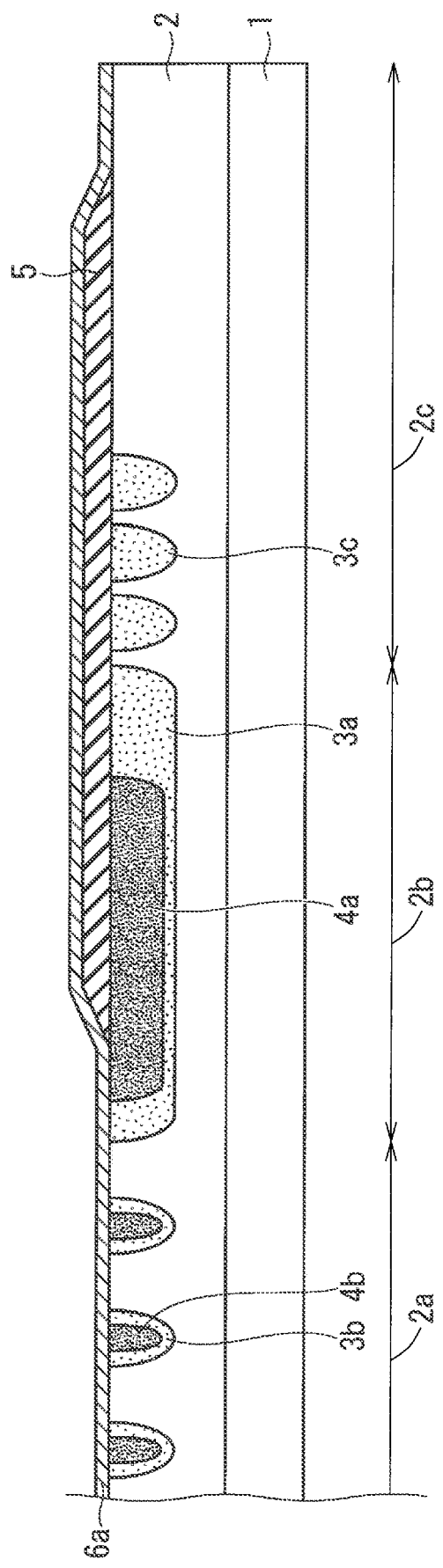

Then, as illustrated in FIG. 7, a first metal film 6a having a thickness of, for example, approximately 200 nm and made of Ti is formed on an entire upper surface of the structure formed in the previous steps, that is, on the oxide film 5 and the drift layer 2 by a sputter deposition method.

Next, as illustrated in FIG. 8, a second metal film 7a having a thickness of, for example, approximately several μm and made of Al or AlSi is formed on an entire upper surface of the structure formed in the previous steps, that is, on the first metal film 6a by a sputter deposition method.

Then, as illustrated in FIG. 9, the first metal film 6a and the second metal film 7a are subjected to dry etching all together, so that a position of the first end 61 of the metallized layer 6, which is a remaining part of the first metal film 6a, and a position of the second end 71 of the electrode 7, which is a remaining part of the second metal film 7a, are made the same in plan view. In the first preferred embodiment, etching gas for this dry etching includes $BCl_3$ and $Cl_2$. This enables highly controllable and uniform etching.

In a case where AlSi is used as a material of the second metal film 7a, which will be the electrode 7, a smaller etching rate of Si, which is one of constituent atoms, may result in that an Si portion becomes an etching mask and may result in that Al, which is the other constituent atom immediately below Si, becomes a columnar residue. However, by adjusting conditions such as a gas flow ratio of $BCl_3/Cl_2$, a vacuum pressure, power, and temperature, etching rates of Al and Si can be optimized, and the residue can be reduced accordingly. In addition, since an etching time of the relatively thick second metal film 7a is not long, an overetching amount of the oxide film 5 and the drift layer 2 around a dicing line at the end of etching of the first metal film 6a, which will be the metallized layer 6, can be minimized.

The dry etching is performed, for example, on conditions that the gas flow ratio of $BCl_3/Cl_2$ is 30 sccm to 40 sccm/120 sccm to 160 sccm, the vacuum pressure is 0.7 Pa, the Mg/RF power is 600 W/50 W to 80 W, and the temperature is 25° C. Furthermore, an end point detector is preferably configured to reduce an overetching amount.

Then, the semiconductor device of FIG. 2 is completed by performing processes such as a process for thinning the buffer layer 1, for example, by polishing the back surface thereof, a process for forming the back surface electrode 9, and a process for forming the coating sealing material 8.

<Overview of the First Preferred Embodiment>

According to the semiconductor device according to the first preferred embodiment described above, dry etching is performed all together, and as a result the position of the first end 61 of the metallized layer 6 and the position of the second end 71 of the electrode 7 match each other in plan view. According to such a configuration, it is possible to suppress gouging or residue, which occurs in the case of wet etching. This can improve reliability of the semiconductor device. Furthermore, the influence of the gouging or residue of the first end 61 of the metallized layer 6 can be suppressed without performing patterning for each of the metallized layer 6 and the electrode 7. This can reduce a manufacturing cost.

The inventor has confirmed by simulation that an electric field intensity increases in a configuration in which there is a residue in the first end 61 of the metallized layer 6, i.e., in a configuration in which the second end 71 of the electrode 7 protrudes more toward the active region 2a side than the first end 61 of the metallized layer 6 in plan view. Specifically, the inventor has confirmed that in a configuration in which the second end 71 is closer to the active region 2a than the first end 61 in plan view, the electric field intensity is about twice as large as that in the configuration of the first preferred embodiment in which the position of the first end 61 and the position of the second end 71 are the same. In view of this, in the first preferred embodiment, it is possible to suppress the increase in the electric field intensity without causing a problem in an electric field distribution.

In the first preferred embodiment, the etching gas for dry etching includes $BCl_3$ and $Cl_2$. According to such a configuration, highly-controllable and uniform etching can be performed.

The inventor has confirmed by simulation that an electric field increases at an end of the $p^+$ injection layer 4a on the termination region 2c side in the configuration in which the end of the $p^+$ injection layer 4a on the termination region 2c side is closer to the active region 2a than the second end 71 of the electrode 7 in plan view. On the other hand, in the first preferred embodiment, the first end 61 and the second end 71 are closer to the active region 2a than the end of the $p^+$ injection layer 4a on the termination region 2c side in plan view. According to such a configuration, an electric field at the end of $p^+$ injection layer 4a on the termination region 2c side can be suppressed. It is preferable that the distance x in FIG. 2 be larger than 0 and equal to or less than 20 μm in view of the result of the simulation and from the viewpoint of a reduction of a chip invalid region (material saving and business cost reduction). That is, it is preferable that the distance x from the first end 61 and the second end 71 to the end of the $p^+$ injection layer 4a on the termination region 2c side be larger than 0 and equal to or less than 20 μm in plan view.

The embodiments and modifications of the present invention can be freely combined and changed or omitted as appropriate within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a buffer layer having a first conductivity type;
    a drift layer provided on the buffer layer and in which an active region, an interface region that surrounds the active region, and a termination region that surrounds the interface region are defined, the drift layer having a first conductivity type;
    a first impurity layer provided in a surface of the drift layer in the interface region, the first impurity layer having a second conductivity type;
    a second impurity layer that is provided in a surface of the first impurity layer, has a side and a bottom covered with the first impurity layer, and has an impurity concentration higher than the first impurity layer, the second impurity layer having a second conductivity type;
    an insulating layer from which the first impurity layer and the second impurity layer on the active region side are exposed and that is provided on the first impurity layer and the second impurity layer on the termination region side;
    a metallized layer provided on the first impurity layer and the second impurity layer exposed from the insulating layer and provided on the insulating layer; and
    an electrode provided on the metallized layer, wherein
    a position of a first end of the metallized layer in the interface region on the termination region side and a position of a second end of the electrode in the interface region on the termination region side are flush with each other in plan view, and
    the first end and the second end are closer to the active region than an end of the second impurity layer on the termination region side in plan view.

2. The semiconductor device according to claim 1, wherein
    the metallized layer includes titanium, molybdenum, or tungsten.

3. The semiconductor device according to claim 1, wherein
    a distance from the first end and the second end to the end of the second impurity layer on the termination region side is larger than 0 and equal to or less than 20 μm in plan view.

4. The semiconductor device according to claim 1, wherein
    the electrode has an exposed surface configured to receive a wire bond.

5. The semiconductor device according to claim 1, wherein
    the electrode is a wire bonding pad.

6. The semiconductor device according to claim 1, wherein
    the electrode is Al or AlSi.

* * * * *